(12) United States Patent  
Mostafazadeh

(10) Patent No.: US 6,812,125 B1  
(45) Date of Patent: Nov. 2, 2004

(54) SUBSTRATE FOR SEMICONDUCTOR PACKAGING

(75) Inventor: Shahram Mostafazadeh, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/342,739

(22) Filed: Jan. 14, 2003

Related U.S. Application Data

(62) Division of application No. 09/611,728, filed on Jul. 7, 2000, now abandoned.

(51) Int. Cl.[7] ............................ H01L 21/44; H01L 23/48
(52) U.S. Cl. ........................ 438/613; 438/612; 438/614; 438/127; 257/737; 257/738
(58) Field of Search ................................ 438/612, 613, 438/614, 617, 629, 637, 640, 667, 672, 124, 127, 639, 668, 675, 700, 701, 713, 712, 112; 257/737, 738, 778, 774, 780, 787

(56) References Cited

U.S. PATENT DOCUMENTS

| | | | |
|---|---|---|---|
| 5,434,452 A | 7/1995 | Higgins, III | .............. 257/773 |
| 5,592,025 A * | 1/1997 | Clark et al. | |
| 5,637,176 A * | 6/1997 | Gilleo et al. | |
| 5,866,949 A | 2/1999 | Schueller | .................. 257/778 |
| 5,891,795 A | 4/1999 | Arledge et al. | ............. 438/613 |
| 5,900,676 A * | 5/1999 | Kweon et al. | |
| 6,268,650 B1 * | 7/2001 | Kinsman et al. | |
| 6,326,555 B1 * | 12/2001 | McCormack et al. | |
| 6,573,458 B1 * | 6/2003 | Matsubara et al. | |

* cited by examiner

*Primary Examiner*—Wael Fahmy  
*Assistant Examiner*—DiLinh Nguyen  
(74) *Attorney, Agent, or Firm*—Beyer Weaver & Thomas LLP

(57) ABSTRACT

A plastic or resin based substrate panel for use in semiconductor package is described. The substrate includes a matrix of conductive elements (e.g. conductive studs, balls or the like) which are held in place by a molding plastic material. The conductive elements form conductive vias through the substrate and have exposed top and bottom surfaces which serve as contacts or landing that may be used to electrically couple electrical devices to the substrate. The substrate panel may be populated with integrated circuits which in turn are electrically connected to the substrate, encapsulated and singulated to form a plurality of packaged integrated circuits.

31 Claims, 4 Drawing Sheets

SUBSTRATE FOR SEMICONDUCTOR PACKAGING

This application is a divisional of Ser. No. 09/611,728 filed on Jul. 7, 2000 now abandoned.

BACKGROUND OF THE INVENTION

The present invention relates generally to substrates suitable for use in the packaging of integrated circuits. More particularly, the invention relates to the formation of simple plastic substrates.

There are a wide variety of integrated circuit packaging approaches that are popular today. One such approach contemplates providing a suitable substrate and mounting an array of integrated circuits on the substrate. The bond pads on the integrated circuits are then electrically connected to landings on the top surface of the substrate using conventional techniques such as wire bonding. The bottom surface of the substrates typically have contacts that can be electrically connected to external devices or landings which serve as attach pads for solder balls or the like that act as the external contacts.

Although the existing substrate based packaging works quite well, in some circumstances the substrate itself is one of the most expensive features of the package. Thus, there are continuing efforts to lower the costs of the substrate.

SUMMARY OF THE INVENTION

A plastic or resin based substrate panel for use in semiconductor package is described. The substrate includes a matrix of conductive elements (e.g. conductive studs, balls or the like) which are held in place by a plastic molding material. The conductive elements form conductive vias through the substrate and have exposed top and bottom surfaces which serve as contacts or landing that may be used to electrically couple electrical devices to the substrate. The conductive elements may be formed from a wide variety of materials, as for example, plated copper.

The substrate panel typically defines a plurality of device areas, which are each arranged to have an associated integrated circuit mounted thereon. A matrix of integrated circuits may be mounted onto the substrate panel and electrically connected to associated contacts within their respective device areas using conventional techniques such as wire bonding. In many embodiments, a plastic encapsulating material is molded over a top surface of the substrate panel to encapsulate the integrated circuits and bonding wires.

In a method aspect of the invention, a multiplicity of conductive elements are place on a tape in a predetermined pattern. A plastic or resin based material is molded around the conductive elements on the tape to form a substrate panel in which the conductive elements form vias through the substrate and have exposed top and bottom surfaces. The substrate panel may be populated with integrated circuits which in turn are electrically connected to the substrate, encapsulated and singulated to form a plurality of packaged integrated circuits.

BRIEF DESCRIPTION OF THE DRAWINGS

The invention may best be understood by reference to the following description taken in conjunction with the accompanying drawings in which like reference numerals refer to similar elements and in which.

DETAILED DESCRIPTION OF THE INVENTION

In order to reduce the costs of substrate panels used in packaging integrated circuits, a plastic based substrate having a pattern of conductive vias is described. One approach to forming the substrate panel is to place a pattern of conductive elements (such as balls or studs) on appropriate tape and then molding a plastic material around the conductive elements to form the substrate.

Figure 1:
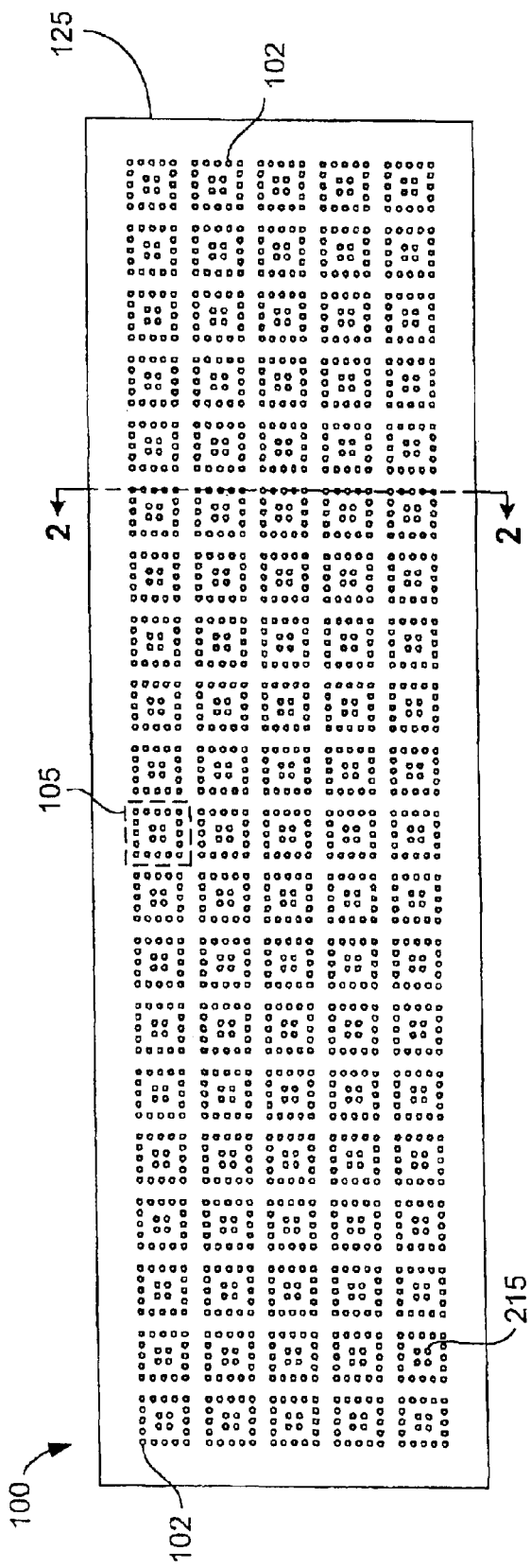
FIG. 1 is a diagrammatic top view of a substrate formed in accordance with one embodiment of the present invention.
Figure 2:
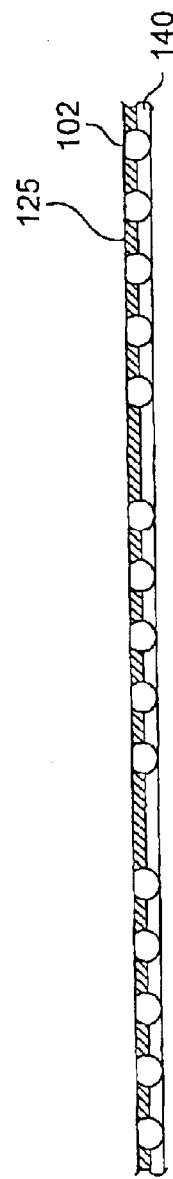
FIG. 2 is a diagrammatic cross sectional end view of the substrate illustrated in FIG. 1.

Referring initially to FIGS. 1 and 2, a fully formed substrate panel 100 having a plurality of conductive vias 102 is illustrated. In the embodiment shown, the panel 100 has an array of device areas 105 defined thereon. Each device area 105 is sized and has an appropriate number of vias 102 that are patterned such that the device area can serve as a substrate for an associated semiconductor device. Thus, the panel 100 serves as the substrate for a number of semiconductor devices. As will be apparent to those familiar with the packaging arts, the panel as well as the device areas on the panel may take a wide variety of geometric forms and have a wide variety of different via patterns. The via pattern for a particular device area will depend largely on the desired contact pattern on the resulting packaged device.

In the embodiment shown in FIG. 1, the panel takes the form of a substrate strip 100 having a 5 by 20 array of device areas 105 thereon. However, significantly higher device area densities are possible. As will be appreciated by those skilled in the art, the number of devices areas in a particular panel may vary widely based on such factors as overall panel dimensions, the number of contacts per devices area and die sizes. It is contemplated that as device sizes get smaller and/or handling equipment gets larger, even larger arrays may be made.

The conductive vias 102 may be formed from a wide variety of conductive materials and can take a wide variety of forms. By way of example, balls or studs made from copper or alloy 42 work well. When copper is used as the base material for the conductor elements, it may be desirable to plate the copper with appropriate coatings to facilitate better wire bonding and/or soldering. By well of example, gold or Nickel Palladium work well as the plating material for copper vias. It should be appreciated, however, that a wide variety of different structures and materials can be used to form the conductive vias and the appropriate plating materials (if any) will vary widely based on the base materials used and the mechanism intended to be used to electrically couple the vias to external boards or devices.

Figure 3:
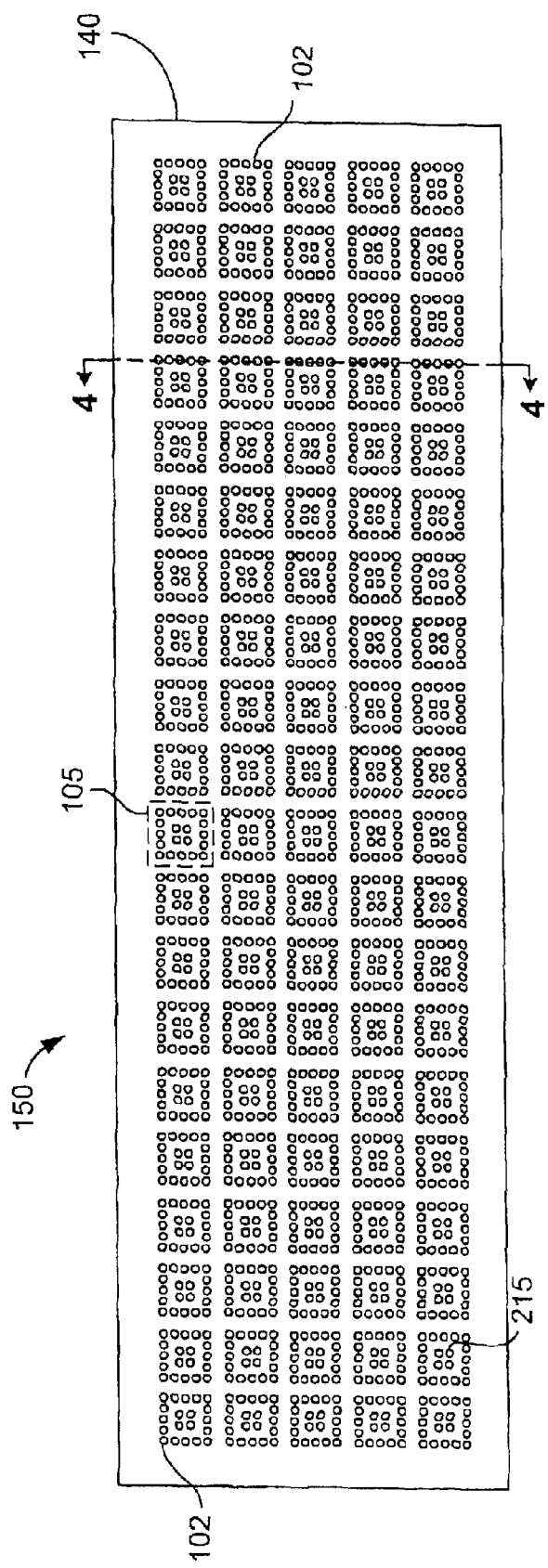
FIG. 3 is a diagrammatic top view of a tape having an array of copper balls placed thereon in preparation for forming a substrate as illustrated in FIG. 1.
Figure 4:
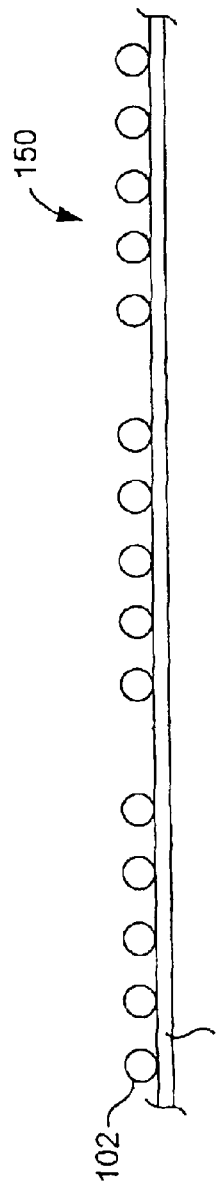
FIG. 4 is diagrammatic cross sectional end view of the patterned tape illustrated in FIG. 3.

Referring next to FIGS. 3–6 a method suitable for forming the described substrate panel will be described. In the embodiment illustrated in the figures, the conductive elements 102 are placed on appropriate tape 140 in the desired via pattern. This arrangement is best illustrated in FIGS. 3 and 4. A variety of different tapes that are suitable for use in plastic molding operations may be used, but by way of example, Kapton tape works well. A support structure (not shown) such as a rigid support panel may optionally be used to support the tape during handling.

Figure 5:
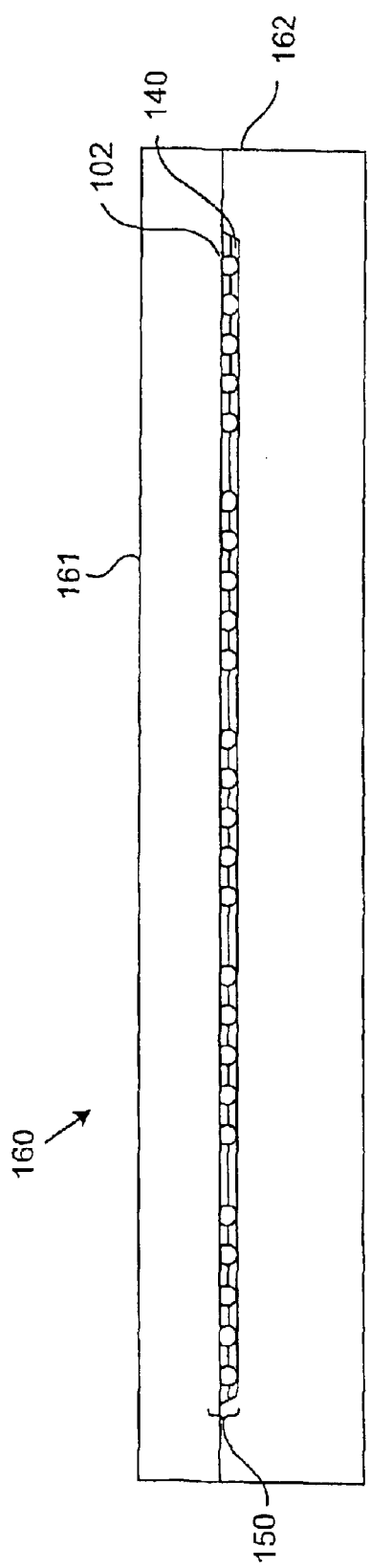
FIG. 5 is a diagrammatic cross sectional side view of a mold having a patterned tape set therein in preparation for molding.
Figure 6:
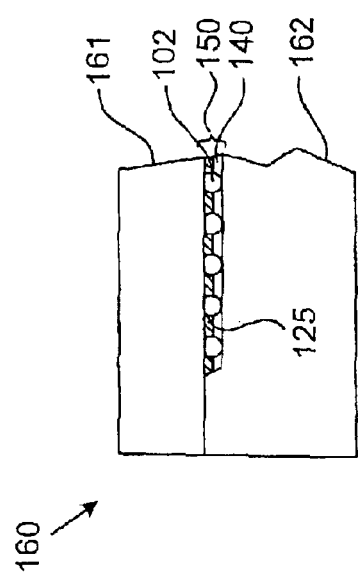
FIG. 6 is a diagrammatic cross sectional side view of the mold of FIG. 5 after molding material has been placed therein.

As illustrated in FIGS. 5 and 6, the patterned tape 150 is placed in an appropriate mold 160 (FIG. 5) and a plastic molding compound is injected into the mold (FIG. 6). Any suitable molding compound may be used. By way of example, any of a number of thermoplastic and thermosetting plastic materials that are commonly used in semiconductor packaging applications work well as the molding compound. During the molding operation, the tape 140 helps prevent molding material flash from adhering to the bottom surface of the conductor elements which helps improve reliability.

The mold 160 is designed to hold the patterned tape 150 (with or without a support structure) in place. By way of example, one suitable mold which uses a vacuum to hold the substrate in place is described in co-pending application Ser. No. 09/596,838, filed on Jun. 9, 2000, and now issued as the U.S. Pat. No. 6,352,838, entitled "Method for Moldine a Bumped Wafer" issued Mar. 5, 2003, which is incorporated herein by reference in its entirety.

In the illustrated embodiment, halls are used to form the vias 102. When balls are used, it is typically advantageous (although not required) to set the depth of the mold at slightly less than the thickness of the ball plus a percentage of the tape thickness. This causes the ball to flatten slightly when the mold is closed which provides a flatter and larger exposed bonding surface on the top side of the substrate as best illustrated in FIGS. 2 and 6. The hard press fit of the contact balls also helps prevent the formation of flash on the top side of the vias 102 during the molding operation.

Figure 7:
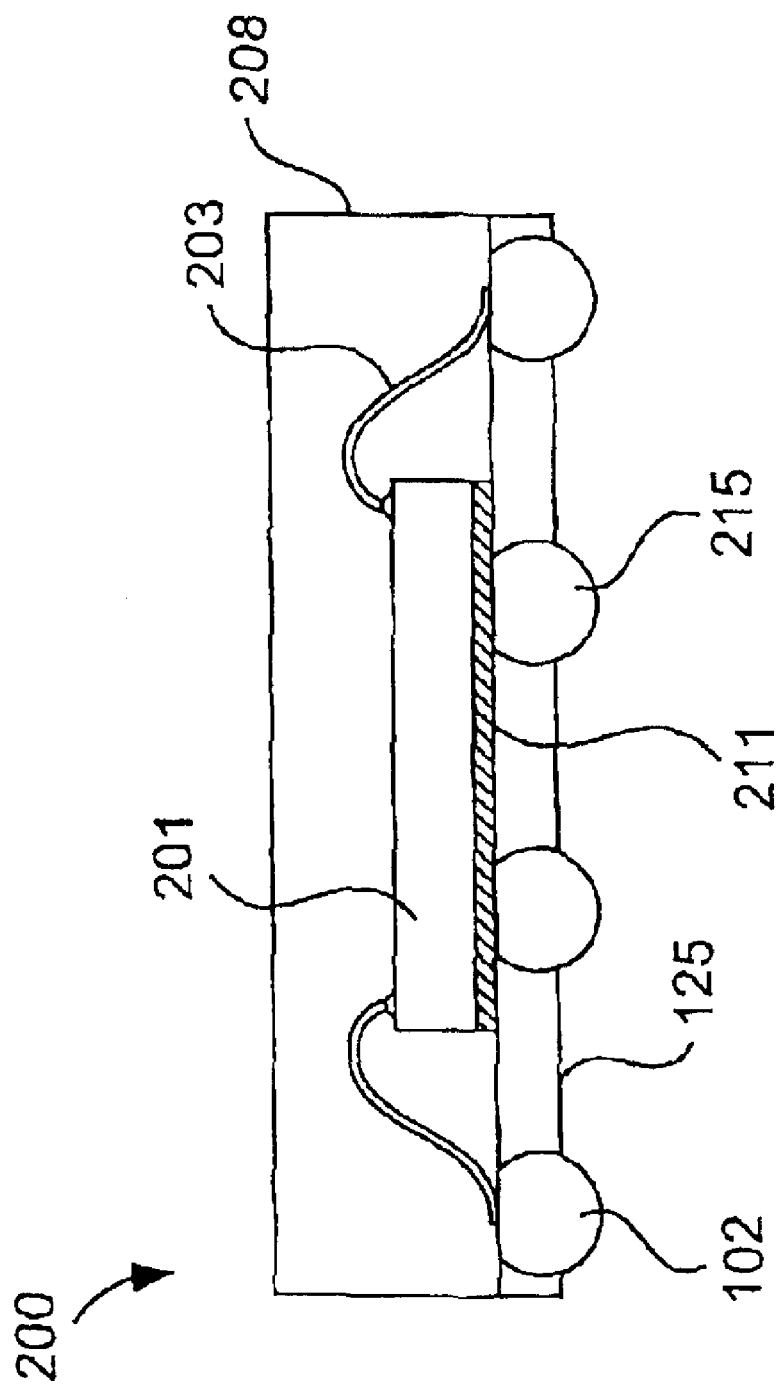
FIG. 7 is cross sectional side view of a packaged integrated circuit that incorporates a substrate formed in accordance with one embodiment of the present invention.

After the substrate panel 100 has been molded and the tape 140 removed, the panel 100 can be used in semiconductor packaging applications in the same manner as current substrates. A representative singulated packaged integrated circuit that utilizes the described substrate is illustrated in FIG. 7. Generally, an array of integrated circuits 201 are attached to the substrate panel 100 using conventional die attach adhesives and/or techniques. In the described embodiment, one integrated circuit die is mounted in each device area 105. However, multi-chip modules can readily be formed by attaching multiple dice to a particular device area.

Input/output (I/O) pads on the dice are then electrically connected to selected vias 102 using any suitable technique such as wire bonding. The bonding wires 203 can be wire bonded directly to the exposed top surface of the vias 102. When wire bonding is used, a protective cap is typically molded over the integrated circuits to encapsulate the bonding wires and protect the integrated circuit dice. Generally, a single protective cap can be used to encapsulate all of the devices on the substrate panel 100. However, in some applications, it may be desirable to provide a plurality of separate caps to cover smaller arrays of the dice within the panel.

After the packaging has been completed, the dice may be tested in panel form since the various vias 102 are not electrically connected to one another. When all of the desired panel level packaging, testing and handling has been completed, the panel may be sawed to form singulated packaged integrated circuits such as the device illustrated diagrammatically in FIG. 7. In the embodiment illustrated in FIG. 7, the resulting packaged semiconductor device 200 has a die 201 that is attached to substrate 140 by the die attach adhesive 211. Bonding wires 203 electrically couple bond pads (not shown) on the die 201 to associated vias 102. The die 201 and bonding wires 203 are encapsulated by an encapsulation material 208 which is simply the appropriate segment of the plastic cap formed during the panel processing.

In the embodiment shown in FIG. 7, which is based on the substrate shown in FIG. 1, thermal conducting vias 215 are provided in the area beneath the die 201. The thermal conducting vias 215 are preferably formed from the same conductive elements (e.g. balls or studs) as the electrically conductive vias, although that is not a requirement. As will be appreciated by those familiar with the art, the thermal conducting vias may be desirable to facilitate cooling the die during operation.

As pointed out above, a wide variety of molding materials can be used to form the substrate panel 100. One suitable class of molding compounds that have some additional advantages are materials having dual stage curing chemistry (sometimes referred to as a B-stageable materials). Such materials can typically be partially cured by exposing the molding material to low level heat during the molding operation in a process referred to as a "pre-cure" or "soft cure." The benefits of using such a material and process are described in co-pending application Serial No. 09/359,074, filed on Jul. 22, 1999, and now issued as the U.S. Pat. No. 6,245,595, entitled "Techniques for Wafer Level Molding of Underfill Encapsulant" issued Jun. 12, 2001, which is incorporated herein by reference in its entirety. Briefly, when a B-stageable material is used, the molding material is partially cured during the substrate formation. This provides a substrate that is relatively rigid and generally suitable for handling. Then, after the substrate has been used as part of a package for a semiconductor device (as described above), and the semiconductor device is being mounted on an appropriate substrate such as a printed circuit board, the B-stageable material is fully cured. Performing the final cure at this stage has been observed to serve work much like an underfill material which can help relieve stresses in the contacts on the mounted semiconductor device as described in the referenced application.

One suitable class of B-stageable molding materials are silica filled polymer resins having dual stage curing chemistry with specific, uncured, pre-cured, and fully cured properties, having, for example, an initial viscosity in the range of approximately 350,000 to approximately 850,000 cP. Examples of such a resin include epoxies, polyimides, and silicone-polyimide co-polymers. The selection of the proper combination of initiators is important. Such a combination would typically include two components, one with a low decomposition temperature (e.g. about 50° C. to about 9° C.) while the other has a high decomposition temperature in the vicinity of eutectic solder reflow temperature (e.g., about 170° C. to about 190° C.). The first initiator will start the "soft cure". In other words, the material will be partially reacted so that a material consistency can be reached to allow for easy post processing and handling. Substrate formation, handling and dicing, for instance, would be facilitated by a soft cure that produces a semi-rigid coating rather than a gel-like state. The second initiator will decompose only when the singulated substrate as part of a packaged device is place on a circuit board or the like for assembly. The higher temperature needed to reflow the solder that attaches to the vias to a circuit board or the like would complete the reaction in the polymer so that the final cured hardened state can be achieved once solder has wetted the vias on the substrate. Although B-stageable molding materials are believed to have certain advantages, it should be appreciated that they are not in any way a requirement of most embodiments of the invention.

Although the foregoing invention has been described in some detail for purposes of clarity of understanding, it will be apparent that various aspects of the described embodiment may be widely varied within the scope of the appended claims. For example, the invention has been illustrated primarily in the context of substrates having a single rectangular array of device areas thereon. However, it should be appreciated that the substrate panel may have a plurality of device regions, with each device region having an array of device areas therein. Additionally, it is not necessary that the arrays be rectangular or have any specific pattern. Accordingly, the present embodiments are to be considered as illustrative and not restrictive, and the invention is not to be limited to the details given herein, but may be modified within the scope and equivalents of the appended claims.

What is claimed is:

1. A method of forming a substrate panel for use in packaging integrated circuits, the method comprising:
   providing a tape;
   placing a multiplicity of conductors on the tape in a predetermined pattern; placing a mold structure around the multiplicity of conductors to define a mold space that contains the multiplicity of conductors; and
   introducing a plastic or resin based material into the mold space so that the plastic or resin based material molds around the conductors on the tape to form the substrate panel in which the conductors effectively form conductive vias through the substrate and have exposed top and bottom surfaces that form contacts or landing that may be used to electrically couple electrical devices to the substrate.

2. A method of packaging integrated circuits comprising:
   attaching a plurality of integrated circuits to a top surface of the substrate panel formed as recited in claim 1;
   wire bonding I/O pads on the integrated circuits to associated conductors to electrically connect the integrated circuits to the substrate panel; and
   molding a plastic cap over the top surface of the substrate panel to encapsulate the integrated circuits and bonding wires.

3. The method of packaging integrated circuits as recited in claim 2 further comprising dicing the substrate panel to form a plurality of singulated packaged integrated circuit devices.

4. A packaged integrated circuit constructed in accordance with the method of 2 wherein the multiplicity of conductors consist essentially of a plurality of ball-shaped conductors; and
   wherein the plastic or resin based material that is molded around the conductors to form the substrate panel is configured so that the ball-shaped conductors are embedded in the plastic or resin based material to effectively form ball-shaped conductive vias through the substrate.

5. The method of claim 1 wherein the substrate panel consists essentially of:
   the multiplicity of conductors consisting essentially of a plurality of ball-shaped conductors; and
   wherein the plastic or resin based material that is molded around the conductors to form the substrate panel is configured so that the ball-shaped conductors are embedded in the plastic or resin based material to effectively form ball-shaped conductive vias through the panel.

6. The method of claim 5 wherein the multiplicity of conductors consisting essentially of the plurality of ball-shaped conductors include a plurality of plated copper ball-shaped conductors.

7. The method of claim 6 wherein the plurality of plated copper ball-shaped conductors are plated with a plating material selected from the group consisting of Gold and Nickel Palladium.

8. The method of claim 6 wherein the conductors are patterned to form an array of device areas, each device area being arranged to have an associated integrated circuit mounted thereon.

9. The method of claim 1 wherein the plastic or resin material used to form the substrate panel is a B-stageable material that is partially cured.

10. The substrate panel formed using the method of claim 1 wherein the substrate panel consists essentially of:
    a multiplicity of ball-shaped conductors consisting essentially of a conductors; and
    wherein the plastic or resin based material is molded around the multiplicity of ball-shaped conductors to form the substrate panel and is configured by the ball-shaped conductors embedded in the plastic or resin based material to effectively form ball-shaped conductive vias through the panel.

11. The substrate panel of claim 10 wherein the substrate panel further includes:
    a plurality of integrated circuits attached to a top surface of the substrate panel;
    I/O pads on the integrated circuits that are wire bonded to associated conductors to electrically connect the integrated circuits to the substrate panel; and
    a plastic cap molded over a top surface of the substrate panel to encapsulate the integrated circuits and bonding wires.

12. The substrate panel of claim 11 wherein the plurality of integrated circuits are singulated into individual integrated circuits.

13. The substrate panel of claim 10 wherein said plurality of ball-shaped conductors include ball shaped conductors wherein at least one of the exposed top and bottom surfaces of the conductors are flattened.

14. A singulated semiconductor device fabricated using the method of claim 1 wherein the semiconductor device comprises:
    a plurality of ball-shaped conductors; and
    the plastic or resin based material that is molded around the conductors to form a substrate with top and bottom surfaces of the conductors exposed, so that the conductors are embedded in the substrate to effectively form ball-shaped conductive vias through the substrate, and the exposed top and bottom surfaces of the conductors form contacts or landings that may be used to electrically couple electrical devices to the substrate;
    a semiconductor die mounted on and attached to a top surface of said molding substrate in a die mounting region with an electrically isolating bonding agent;
    a plurality of electrically conductive wire bonds directly connecting a respective I/O pads on said semiconductor die to associated conductive vias in said substrate;
    a protective packaging enclosure wherein the semiconductor die and said plurality of electrical interconnections are enclosed within an encapsulating material.

15. A method of forming a substrate panel for use in packaging integrated circuits, the method comprising:

placing a multiplicity of conductors on a tape in a predetermined pattern such that at least one of an exposed top and bottom surface of the conductors are flattened;

placing a mold around the multiplicity of conductors; and forming the substrate panel by injecting the mold with at least one of a plastic and resin based material so that said at least one of the plastic and resin based material molds around the multiplicity of conductors on the tape and fills substantially all of the mold to form the substrate panel wherein the conductors form conductive vias through the substrate panel and have exposed top and bottom surfaces that form at least one of contacts and landings that may be used to electrically couple electrical devices to the substrate panel.

16. The method of forming a substrate panel as in claim 15, wherein forming the substrate panel further includes curing the at least one of the plastic and resin based material to form the substrate panel.

17. The method of forming a substrate panel as in claim 16, wherein forming the substrate panel further includes removing the substrate from the mold.

18. A method of packaging integrated circuits comprising:

attaching a plurality of integrated circuits to the top surface of the substrate panel formed as recited in claim 15;

wire bonding I/O pads on the integrated circuits to associated conductors to electrically connect the integrated circuits to the substrate panel; and molding a plastic cap over a top surface of the substrate panel to encapsulate the integrated circuits and bonding wires.

19. The method of packaging integrated circuits as recited in claim 18 further comprising dicing the substrate panel to form a plurality of singulated packaged integrated circuit devices.

20. A method of forming a substrate panel for use in packaging integrated circuits, the method comprising:

providing a tape;

positioning a multiplicity of conductors on the tape in a predetermined pattern;

positioning a mold frame so that it encloses the multiplicity of conductors; and introducing one of a plastic or resin based material into the mold frame so that it molds around the conductors on the tape to form the substrate panel in which the multiplicity of conductors form a plurality of conductive vias through the substrate having exposed top and bottom surfaces.

21. The method of claim 20 wherein introducing one of the plastic or resin based material into the mold frame comprises injection molding the plastic or resin based material into the mold frame.

22. The method of claim 20 further comprising removing the mold frame from the substrate panel.

23. The method of claim 22 further comprising:

attaching a plurality of integrated circuits to a top surface of the substrate panel;

wire bonding I/O pads of the integrated circuits to associated conductors to electrically connect the integrated circuits to the substrate panel; and molding a plastic cap over a top surface of the substrate panel to encapsulate the integrated circuits and bonding wires.

24. The method of claim 23 further comprising singulating the substrate panel to form a plurality of separated packaged integrated circuit devices.

25. The method of claim 20 further comprising curing the plastic or resin based material forming the substrate panel.

26. The method of claim 20 wherein the plastic or resin based material used to form the substrate panel further comprises a B-stageable material.

27. The method of claim 20 wherein the predetermined pattern of conductors forms an array of device areas with each device area being configured to have an associated integrated circuit mounted thereon.

28. The method of claim 20 wherein positioning the multiplicity of conductors on the tape in the predetermined pattern comprises providing a multiplicity of substantially ball-shaped conductors and positioning the substantially ball-shaped conductors in said predetermined pattern.

29. The method of claim 28 wherein the multiplicity of substantially ball-shaped conductors flattened top and bottom surfaces.

30. The method of claim 29 wherein placing the mold frame is conducted such that pressure exerted by the mold frame on the multiplicity of substantially ball-shaped conductors flattens the top and bottom surfaces of the conductors.

31. The method of claim 20 wherein the multiplicity of conductors are configured to include a layer of conductive material formed thereon.

\* \* \* \* \*

UNITED STATES PATENT AND TRADEMARK OFFICE
CERTIFICATE OF CORRECTION

PATENT NO. : 6,812,125 B1
DATED : November 2, 2004
INVENTOR(S) : Mostafazadeh et al.

It is certified that error appears in the above-identified patent and that said Letters Patent is hereby corrected as shown below:

Column 3,
Line 25, change "Method for Moldine" to -- Method for Molding --.
Line 28, change "halls are used" to -- balls are used --.

Column 4,
Line 56, change "9º C" to -- 90º C --.

Column 7,
Lines 18 and 22, change "a substrate panel" to -- the substrate panel --.

Signed and Sealed this

Twenty-sixth Day of April, 2005

JON W. DUDAS
*Director of the United States Patent and Trademark Office*